United States Patent [19]

Shinn, II

[11] 4,048,577

[45] Sept. 13, 1977

[54] RESISTOR-CONTROLLED CIRCUIT FOR IMPROVING BANDWIDTH OF CURRENT GAIN CELLS

[75] Inventor: Charles E. Shinn, II, Los Altos, Calif.

[73] Assignee: Hewlett-Packard Company, Palo Alto, Calif.

[21] Appl. No.: 684,516

[22] Filed: May 7, 1976

[51] Int. Cl.$^2$ .............................................. H03F 3/45
[52] U.S. Cl. .................................. 330/30 D; 330/22
[58] Field of Search .................... 330/22, 30 R, 30 D, 330/40, 65

[56] References Cited

U.S. PATENT DOCUMENTS 3,622,903  11/1971  Steckler ............................. 330/30 D
3,723,895  3/1973   Peril ............................. 330/30 D X
3,849,735  11/1974  Haenen et al. .................... 330/30 D Primary Examiner—James B. Mullins
Attorney, Agent, or Firm—Robert S. Hulse; David A. Boone

[57] ABSTRACT

A gain cell circuit is disclosed having an outer pair of common base transistors and an inner pair of common emitter transistors. External base resistors and emitter resistors are added to the common base transistors for controlling the zero formed by the internal capacitance of the common base transistors, thereby cancelling the dominant pole formed by the common emitter transistors and providing compensation and improvement in gain cell bandwidth.

4 Claims, 6 Drawing Figures

RESISTOR-CONTROLLED CIRCUIT FOR IMPROVING BANDWIDTH OF CURRENT GAIN CELLS

BACKGROUND OF THE INVENTION

This invention relates to wide-band amplifiers in general and to gain cell amplifier circuits in particular. The use of the gain cell, shown in FIG. 1, to improve signal bandwidth is known to the prior art. Refer, for example, to the article entitled "A New Wide-Band Amplifier Technique" by Barrie Gilbert, published in the IEEE Journal of Solid-State Circuits Vol. SC-3, No. 4, December 1968. In FIG. 1, $I_{in}$ and $\bar{I}_{in}$ represent differential input currents, $I_{OUT}$ and $\bar{I}_{OUT}$ represent differential output currents, $I_E$ represents circuit bias current, and $V_{REF}$ represents circuit bias voltage.

However, to achieve improvements in signal bandwidth by compensation (i.e., by introducing a zero to cancel the dominant pole as described, for example, in the pole-zero cancellation method of E. M. Cherry and D. E. Hooper in *Amplifying Devices and Low Pass Amplifier Design*, J. Wiley and Sons Inc., New York, 1968, FIG. 13.1(e) page 635), it is common practice to add emitter resistors and shunt capacitors (external capacitance) to the inner pair of transistors Q2 and Q3 in such a way, as shown in FIG. 2, as to satisfy the relationship $$R_E C_E = 1/f_T \qquad (1)$$

where $R_E$ represents the values of the resistors connected to the inner pair of transistors Q2 and Q3, $C_E$ represents the external capacitance of the circuit, i.e., the capacitance of the shunt capacitors across $R_E$, and $f_T$ represents transistor gain bandwidth product.

Because this method of compensation utilizing shunt capacitors is dependent on $C_E$ and $f_T$, in addition to $R_E$, inexact compensation and, hence, limited bandwidth improvements results whenever there are large variations in $C_E$ or in $f_T$. To provide significant improvement in signal bandwidth, therefore, a gain cell circuit is needed capable of providing compensation independent of the external capacitance ($C_E$) of the circuit or the gain bandwidth product ($f_T$). A further problem with the method of using shunt capacitors in prior art monolithic integrated circuits is the difficulty in fabricating capacitors to suitable tolerances and the difficulty in minimizing parasitic capacitance.

SUMMARY OF THE INVENTION

In accordance with the preferred embodiments of the present invention a gain cell circuit is provided having no capacitors, and having an outer pair of common base transistors, an inner pair of common emitter transistors, and external base and emitter resistors coupled to the common base transistors for the purpose of providing compensation independent of external capacitance or the gain bandwidth product of the circuit.

DESCRIPTION OF THE PREFERRED EMBODIMENT

Figure 1:
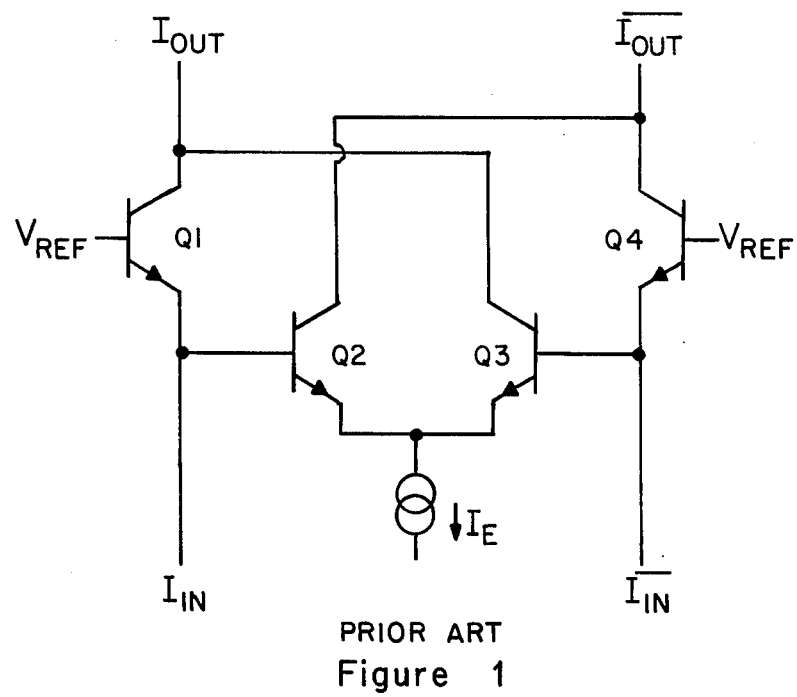
FIG. 1 is a circuit diagram of a gain cell of the prior art.

FIG. 1 shows a gain cell amplifier circuit of the prior art. This circuit has a significant bandwidth because the inner pair of matched transistors (i.e., having substantially similar $\beta$, $f_T$ and temperature characteristics) Q2 and Q3, which are connected as a cross-coupled common emitter differential pair, can be operated at a gain less than unity yet produce an overall circuit gain greater than unity as a result of the contribution of signal from the outer pair of matched common-base transistors Q1 and Q4. The zero formed by the common base state transistors Q1 and Q4 has an impedance value of $2\pi f r_{bb} f_T$, where $f$ represents the frequency of a signal applied to the circuit at which frequency the impedance of the zero is calculated, $r_{bb}$ represents the internal base spreading resistance of the circuit, and $f_T$ represents the gain bandwidth product as described in equation (1) hereinbefore.

Figure 3:
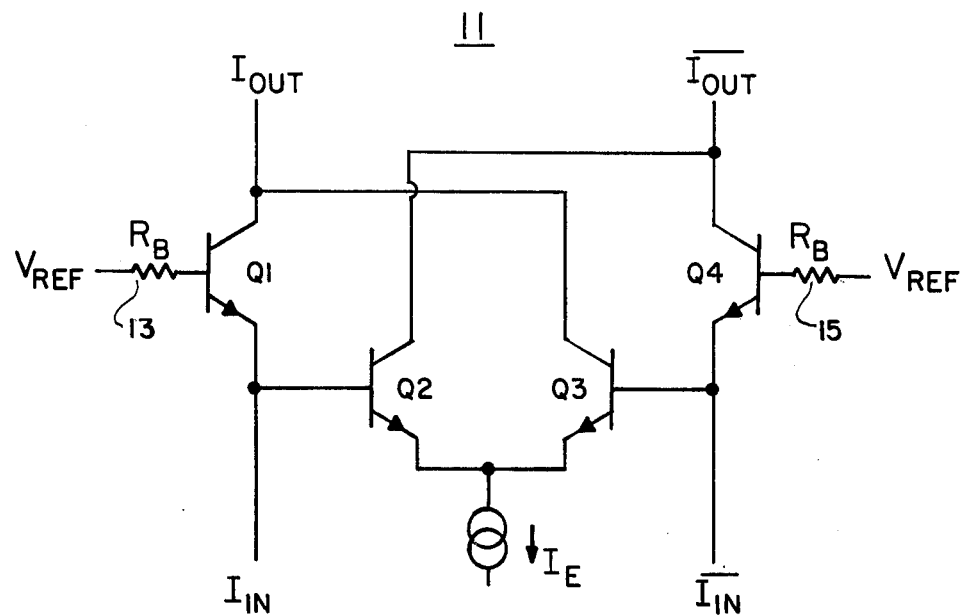
FIG. 3 is a circuit diagram of the gain cell of FIG. 1 with external base resistors added for improved circuit bandwidth in accordance with the preferred embodiment of the present invention.

FIG. 3 shows an improved gain cell amplifier circuit 11 of the present invention. This circuit 11 includes a pair of matched (substantially similar in resistance characteristics) external base resistors ($R_B$) 13, 15 coupled to transistors Q1 and Q4. By use of this circuit 11, a bandwidth significantly greater than the bandwidth of the circuit of FIG. 1 can be achieved. Circuit 11 provides a method of controlling the zero, formed by the internal (inherent) capacitance of the base-emitter junction of the common base transistors Q1 and Q4, so as to cancel the dominant pole formed by the internal capacitance of the base-emitter junction of the common emitter transistors Q2 and Q3.

Figure 2:
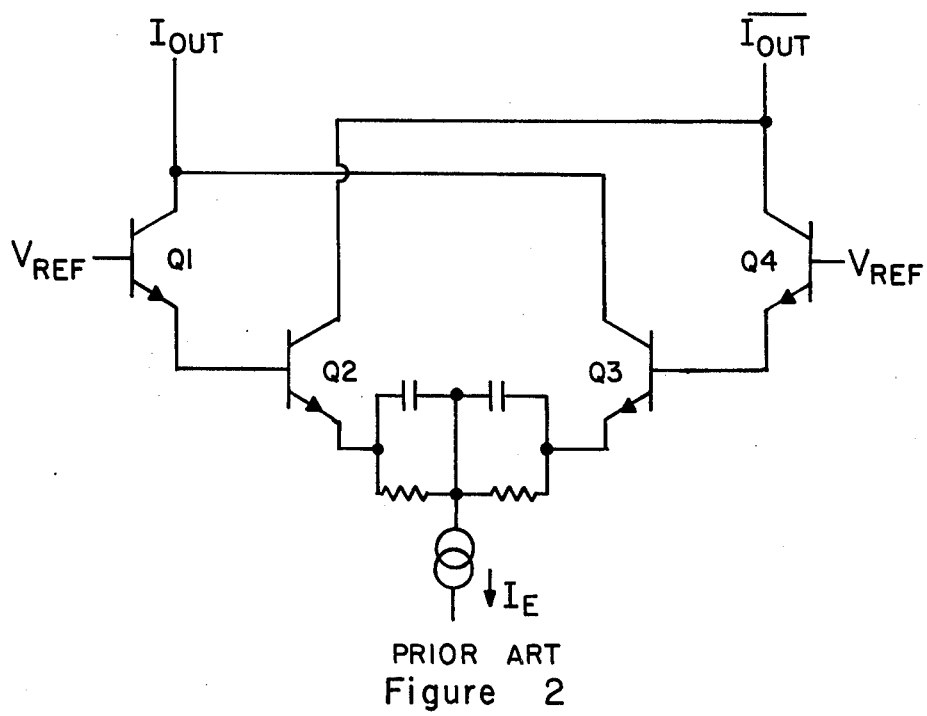
FIG. 2 is a circuit diagram of the gain cell of FIG. 1 with shunt capacitors and emitter resistors added as practiced in the prior art to provide compensation.

When, for a given input signal frequency, the internal base-emitter capacitance of the common-emitter transistors Q2 and Q3 causes a reduction in gain of the circuit 11, the external base resistors 13, 15 may be adjusted to increase the input impedance of the common-base transistors Q1 and Q4, thereby shunting more of the input signal current into the base of the common-emitter transistors Q2 and Q3. This compensates for the reduction in circuit gain. No external capacitance is added to the circuit, as is customary in practice of the prior art as shown in FIG. 2. This absence of external capacitance eliminates dependence of the compensation method upon the variable $C_E$.

Furthermore, the compensation method permissible by circuit 11 is independent of variation in $f_T$ across a wafer of integrated circuits because both the dominant pole and the zero are proportional to $f_T$ and thus change together. This method, which depends solely on the resistance of the circuit and not on the variables $C_E$ and $f_T$, therefore, provides a significant improvement in compensation, and hence bandwidth, over the method of the prior art which provided inexact compensation for large variations in $C_E$ or $f_T$ because of prior art dependance on $C_E$ and $f_T$.

Figure 4:
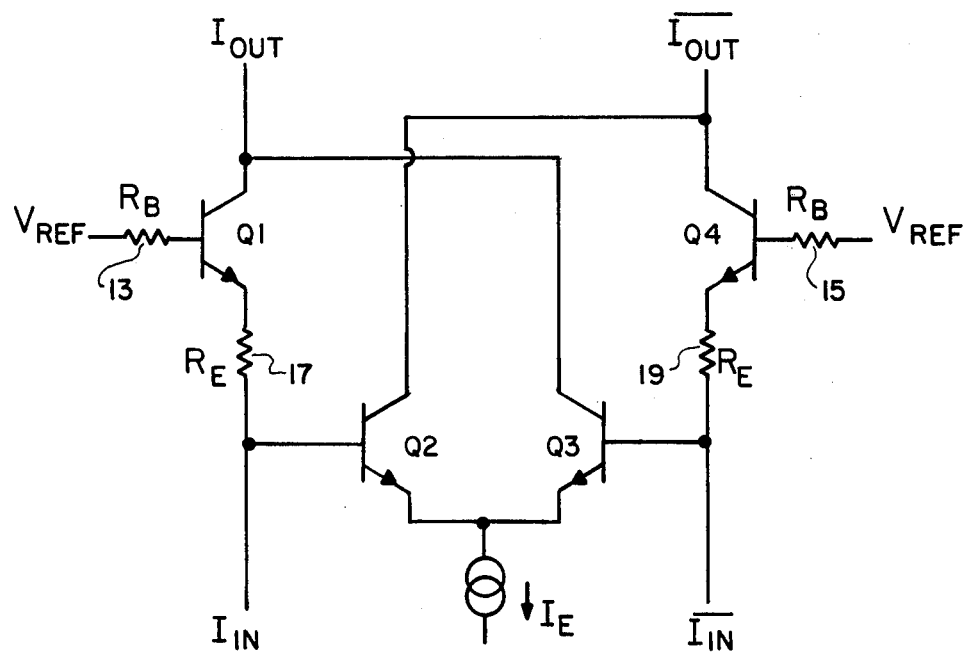
FIG. 4 is a circuit diagram of the gain cell of FIG. 3 with a pair of emitter resistors added for control of the signal frequency at which compensation takes place.

An alternate embodiment of the present invention is shown in FIG. 4 to include emitter resistors 17, 19 for greater control of the zero. This addition of emitter resistors increases the low frequency input impedance of the common base state transistors Q1 and Q4, thereby increasing DC resistance from $(r_e + [R_B + r_{bb}/\beta])$ to $(R_E + r_e + [R_B + r_{bb}/\beta])$, where $r_e$ represents the intrinsic emitter resistance between the emitter terminal and the base-emitter junction of each of the transistors Q1 and Q4, and $\beta$ represents the current gain of each of the transistor Q1 and Q4.

Figure 5A:
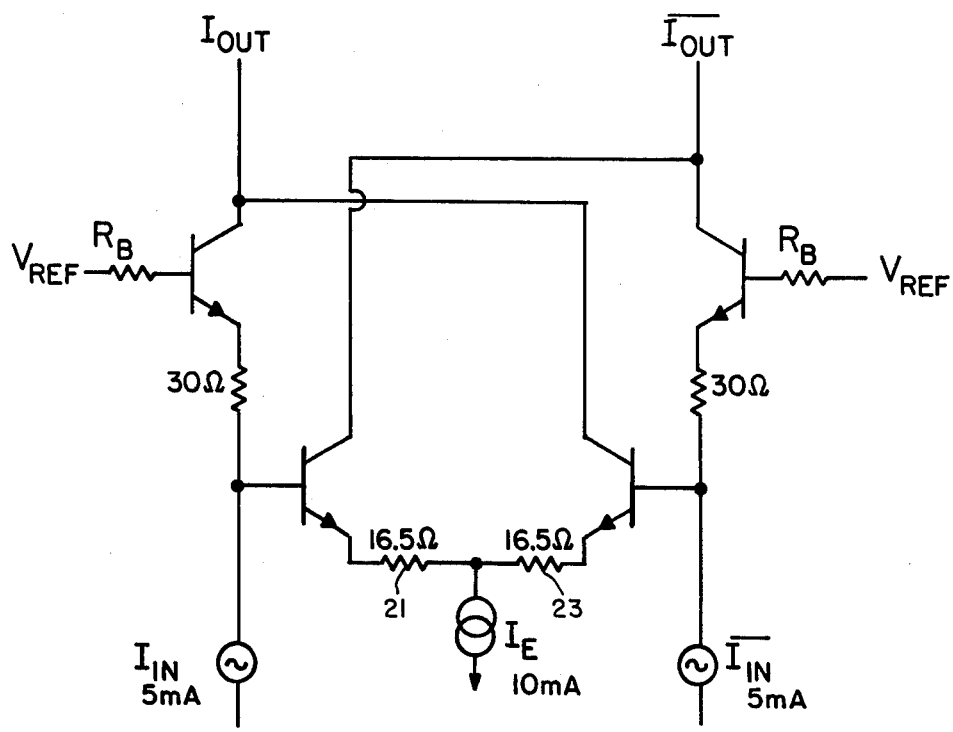
FIG. 5A is a circuit diagram of 7dB amplifier utilizing the circuit of FIG. 4 having an additional pair of emitter resistors for greater bandwidth improvement.
Figure 5B:
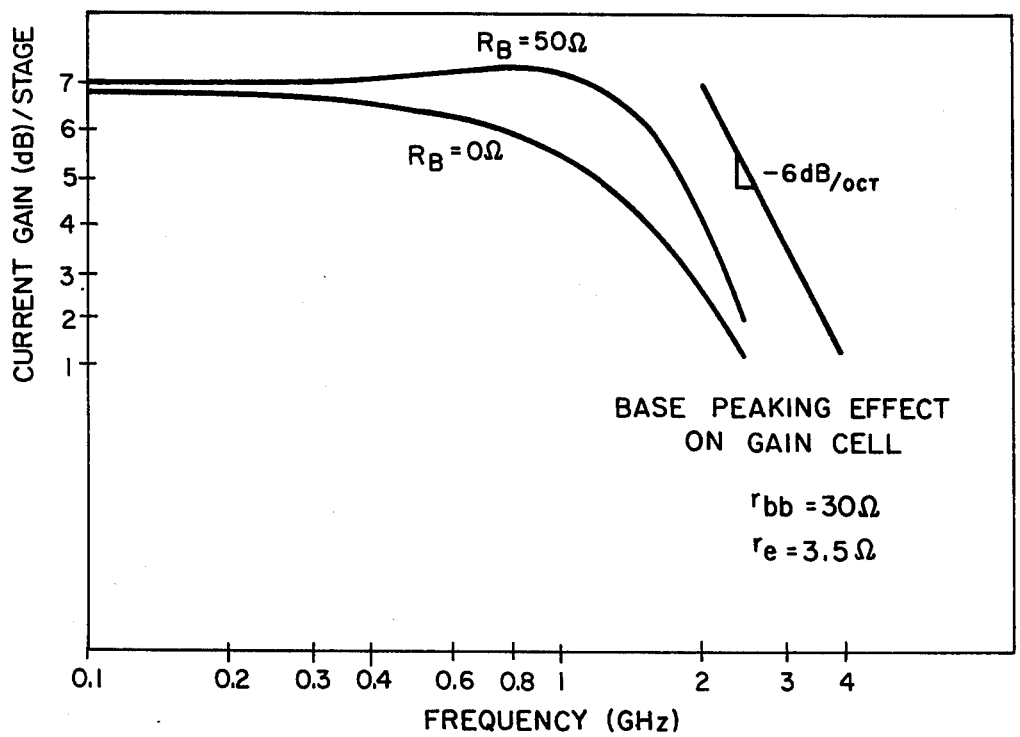
FIG. 5B is a waveform diagram showing bandwidth improvement using the circuit of FIG. 5A.

FIG. 5B shows a 33 percent improvement in bandwidth obtained in a 7 dB amplifier utilizing the circuit of FIG. 5A with additional emitter resistors 21 and 23. It is to be noted that improved bandwidth can also be obtained without zero cancellation if the poles are adjusted by $R_B$ to a point which is just before they become complex. It is desirable, however, to utilize the resistor-controlled method of the present invention to obtain zero cancellation because the sensitivity of the bandwidth to the total base resistance becomes undesirably high when zero cancellation is not achieved.

I claim:

1. A gain-cell circuit with transistors each having a base, a collector and an emitter for providing increased signal bandwidth by utilizing the capacitance inherent in the transistors to achieve pole-zero cancellation, the circuit comprising:

a first matched differential pair of common emitter transistors for producing a first pair of intermediate signals at its collectors and forming a dominant pole in response to a bias current applied to its emitters and differential input signal currents applied to its bases;

a second matched pair of common-base transistors, the emitters of which are coupled to the bases of the transistors of the first matched pair and coupled to receive the differential input signal currents for producing a second pair of intermediate signals at its collectors, the collectors of said second matched pair of transistors being cross-coupled to the collectors of the first matched pair of transistors for producing differential output signal currents by combining selected ones of the first pair of intermediate signals with selected ones of the second pair of intermediate signals; and a matched pair of resistor means each coupled to the base of one of said second matched pair of common base transistors and coupled to a common reference voltage source for causing the second matched pair of transistors to form a zero substantially cancelling the dominant pole formed by the first matched pair of transistors.

2. The circuit of claim 1 wherein said differential input signal currents are approximately 180° out-of-phase with respect to each other, and said differential output signal currents are correspondingly 180° out-of-phase with respect to each other.

3. The circuit of claim 2 wherein said circuit includes a second matched pair of resistors each coupled to an emitter of one of the second matched pair of common-base transistors for providing a greater increase in signal bandwidth in response to said differential input signal currents.

4. The circuit of claim 3 wherein said circuit further includes a third matched pair of resistors each coupled to an emitter of one of the first matched pair of common-emitter transistors for providing a further increase in signal bandwidth.

* * * * *